(12) United States Patent
Okada et al.

(10) Patent No.: US 10,692,986 B2
(45) Date of Patent: Jun. 23, 2020

(54) COMPOUND FILM OF TUNGSTEN AND GERMANIUM, AND SEMICONDUCTOR DEVICE

(71) Applicant: NATIONAL INSTITUTE OF ADVANCED INDUSTRIAL SCIENCE AND TECHNOLOGY, Tokyo (JP)

(72) Inventors: Naoya Okada, Ibaraki (JP); Noriyuki Uchida, Ibaraki (JP); Toshihiko Kanayama, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 16/302,441

(22) PCT Filed: Jun. 15, 2017

(86) PCT No.: PCT/JP2017/022205
§ 371 (c)(1),
(2) Date: Nov. 16, 2018

(87) PCT Pub. No.: WO2017/217512
PCT Pub. Date: Dec. 21, 2017

(65) Prior Publication Data
US 2019/0207007 A1    Jul. 4, 2019

(30) Foreign Application Priority Data

Jun. 17, 2016   (JP) ................................ 2016-120390

(51) Int. Cl.
*H01L 29/45* (2006.01)
*H01L 21/285* (2006.01)
(Continued)

(52) U.S. Cl.
CPC .............. *H01L 29/45* (2013.01); *C23C 16/06* (2013.01); *H01L 21/28* (2013.01); *H01L 21/285* (2013.01);
(Continued)

(58) Field of Classification Search
CPC . H01L 29/45; H01L 29/456; H01L 21/28568; H01L 29/786; H01L 29/78;
(Continued)

(56) References Cited

U.S. PATENT DOCUMENTS 5,162,246 A      11/1992  Ozturk et al.
5,391,394 A  *   2/1995   Hansen .................. C23C 16/04
                                              257/E21.165
(Continued)

FOREIGN PATENT DOCUMENTS

JP    3-126836         5/1991
JP    04-334019    *  11/1992  ............. H01L 21/28
(Continued)

OTHER PUBLICATIONS

Gaudet et al., "Thin film reaction of transition metals with germanium", J. Vac. Sci. Technol. A 24(3), May/Jun. 2006, pp. 474-485.
(Continued)

*Primary Examiner* — Selim U Ahmed
(74) *Attorney, Agent, or Firm* — Staas & Halsey LLP

(57) ABSTRACT

A compound film of tungsten and germanium useful for semiconductor devices, a semiconductor device using the compound film and a method and an apparatus for manufacturing the compound film. Various embodiments include a compound film of tungsten and germanium, which has a germanium/tungsten composition ratio of 0.2 or more and
(Continued)

less than 6 and includes an optical energy gap. The compound film of tungsten and germanium is produced on a substrate by causing a material gas of tungsten and a material gas of germanium to undergo a chemical reaction in at least one of a region in a gas phase and a region on the substrate. Various embodiments include a semiconductor device including a stack structure in which a semiconductor substrate, a compound film of tungsten and germanium having a germanium/tungsten composition ratio of 1 or more and 3.2 or less, and a metal electrode are laminated in this order.

19 Claims, 18 Drawing Sheets

(51) Int. Cl.
  *C23C 16/06* (2006.01)
  *H01L 21/28* (2006.01)
  *H01L 29/78* (2006.01)
  *H01L 29/417* (2006.01)
  *H01L 29/786* (2006.01)

(52) U.S. Cl.
  CPC ...... *H01L 21/28568* (2013.01); *H01L 29/417* (2013.01); *H01L 29/456* (2013.01); *H01L 29/78* (2013.01); *H01L 29/786* (2013.01)

(58) Field of Classification Search
  CPC ..... H01L 29/417; H01L 21/285; H01L 21/28; H01L 2924/01074; H01L 2924/01032; H01L 21/67248; H01L 21/67098; H01L 21/02532; C23C 16/06
  See application file for complete search history.

(56) References Cited

U.S. PATENT DOCUMENTS

| | | | | |
|---|---|---|---|---|
| 5,731,245 | A | * | 3/1998 | Joshi .................. H01L 21/321 |
| | | | | 257/E21.304 |
| 2008/0274598 | A1 | | 11/2008 | Ramin et al. |
| 2010/0060126 | A1 | * | 3/2010 | Eguchi .................. H01J 1/316 |
| | | | | 313/1 |

FOREIGN PATENT DOCUMENTS

| | | | | |
|---|---|---|---|---|
| JP | | 4-334019 | 11/1992 | |
| JP | | 11-340116 | 12/1999 | |
| JP | | 2002-038258 | * 2/2002 | ............ C23C 14/34 |
| JP | | 2002-38258 | 2/2002 | |
| JP | | 2011-66401 | 3/2011 | |
| JP | | 2014-67804 | 4/2014 | |
| WO | WO 2009/107669 | | 9/2009 | |
| WO | WO 2015/174240 A1 | | 11/2015 | |

OTHER PUBLICATIONS

Mutsaers et al., "Reduction of $WF_6$ using $GeH_4$", Applied Surface Science 73 (1993) 82-85.
Wang et al., "Geometries and Electronic Properties of the Tungsten-Doped Germanium Clusters: $WGe_n(n=1-17)$", J. Phys. Chem. A2006, 110, (2006) 12670-12677.
Okada et al., "Si-rich W silicide films composed of W-atom-encapsulated Si clusters deposited using gas-phase reactions of $WF_6$ with $SiH_4$," The Journal of Chemical Physics 144, 084703 (2016).
Tauc, "Absorption Edge and Internal Electric Fields in Amorphous Semiconductors", Mat. Res. Bull. vol. 5, pp. 721-730, 1970.
International Search Report dated Sep. 5, 2017 in corresponding International Application No. PCT/JP2017/022205.
Written Opinion of the International Searching Authority dated Sep. 5, 2017 in corresponding International Application No. PCT/JP2017/022205.
Extended European Search Report dated Jan. 2, 2020 in corresponding European Patent Application No. 17813406.0.

* cited by examiner

COMPOUND FILM OF TUNGSTEN AND GERMANIUM, AND SEMICONDUCTOR DEVICE

CROSS-REFERENCE TO RELATED APPLICATIONS

This application is a National Phase application which claims the benefit under 35 U.S.C. § 371 of International Patent Application No. PCT/JP2017/022205 filed Jun. 15, 2017 which claims the foreign priority benefit under 35 U.S.C. § 119 of Japanese Patent Application No. 2016-120390, filed on Jun. 17, 2016, the disclosures of which are incorporated herein by reference.

TECHNICAL FIELD

The present invention relates to a compound film of tungsten and germanium having excellent electric characteristics, a semiconductor device using the compound film of tungsten and germanium, and a method and an apparatus for manufacturing the compound film of tungsten and germanium.

BACKGROUND ART

In the technical field of semiconductor devices, transition metal-silicon compounds made of transition metal and silicon are widely used as electrode materials of devices made of silicon. A transition metal-silicon compound is also called a "transition metal silicide film" or "transition metal silicide" or a "transition metal-silicon compound." The transition metal-silicon compound has excellent heat-resistant, oxidation resistant, corrosion resistant and electrically conductive characteristics. Furthermore, a producing process of a transition metal-silicon compound has high affinity to a manufacturing process of an LSI using silicon or the like.

On the other hand, research and development of devices made of germanium which excels silicon in electric characteristics are underway in recent years. Examples of types of devices include transistors, light-emitting devices, light-receiving devices and solar batteries. For the same reason as the reason for using a transition metal-silicon compound as an electrode material in a silicon device, a transition metal-germanium compound made of transition metal and germanium is expected as an electrode material of a germanium device. The transition metal-germanium compound is also called a "transition metal germanide film."

When a transition metal film is deposited on a germanium substrate and the transition metal film is then subjected to heat treatment, transition metal reacts with germanium on the germanium surface, and it is possible to synthesize a compound of the transition metal and germanium. A type of the transition metal used in this method is, for example, nickel having a low melting point. On the other hand, it is known that tungsten which has a highest melting point among transition metals does not react with germanium even when subjected to heat treatment on the order of 900° C. close to the melting point of germanium (see Non Patent Literature 1).

As a thin film made up of a compound of tungsten and germanium, a tungsten film is known which contains germanium having a small germanium/tungsten composition ratio of 0.18 or less (see Non Patent Literature 2). This film is produced using a gas phase reaction film forming method using a material gas of $GeH_4$ and $WF_6$.

Regarding one cluster of tungsten germanium, a relationship between the composition ratio of W and Ge and the HOMO-LUMO (gap $E_{HL}$ between the highest occupied molecular orbital (HOMO) and lowest unoccupied molecular orbital (LUMO)), theoretically calculated through a first principle calculation, is known (see Non Patent Literature 3).

The present inventors previously proposed a transition metal-silicon compound film relating to $MSi_n$ (where, M: transition metal, Si: silicon, n=7 to 16) and proposed a semiconductor device using the transition metal-silicon compound film (see Patent Literature 1, Patent Literature 2).

Furthermore, the present inventors previously proposed a method for manufacturing a tungsten silicon compound film relating to $MSi_n$ (where, M: tungsten, Si: silicon, n 12) (see Non Patent Literature 4).

As a result of search for prior documents related to the present application, a patent literature describing tungsten germanium (WGe) as an example of an electrode material for semiconductor devices was found (see Patent Literature 3).

Furthermore, the method for calculating an optical energy gap is known (see Non Patent Literature 5).

CITATION LIST

Patent Literature

Patent Literature 1: International Publication No. WO2009/107669
Patent Literature 2: Japanese Patent Laid-Open No. 2011-66401
Patent Literature 3: Japanese Patent Laid-Open No. 2014-067804

Non Patent Literature

Non Patent Literature 1: Journal of Vacuum Science & Technology A 24, 474 (2006),
Non Patent Literature 2: Applied Surface Science 73,82 (1993).
Non Patent Literature 3: The Journal of Physical Chemistry A 110, 12670 (2006),
Non Patent Literature 4: The Journal of Chemical Physics 144, 084703 (2016),
Non Patent Literature 5: Materials Research Bulletin 5, 721(1970).

SUMMARY OF INVENTION

Technical Problem

Problems of the compound film of tungsten and germanium and the manufacturing method will be described hereinafter.

The tungsten silicon compound made of tungsten and silicon can be produced by depositing tungsten on a silicon substrate and then performing heat treatment thereto at approximately 800° C. On the other hand, the tungsten germanium compound made of tungsten and germanium cannot be produced by depositing tungsten on a germanium substrate and then performing heat treatment thereto. This is because the melting point of the germanium substrate is lower than the temperature at which tungsten reacts with germanium. That is, producing a compound of tungsten and germanium requires heating at a temperature higher than the temperature at which the germanium substrate is melted.

Therefore, it has been impossible so far to apply the compound of tungsten and germanium to electronic devices using germanium. Moreover, no tungsten germanium compound film provided with useful characteristics has been realized as semiconductor devices.

On the other hand, it is possible to produce a tungsten germanium compound made of tungsten and germanium by performing heat treatment under a high pressure. It is possible to produce a single bulk material using this method, but it is difficult to produce a thin film, a thickness of which is controlled in nanometer-order, on a substrate.

With a thin film composed of a tungsten germanium compound which has been conventionally realized (small ratio where a germanium/tungsten composition ratio is 0.18 or less) (see Non Patent Literature 2), germanium in the tungsten film is treated as an impurity that deteriorates electric characteristics of the tungsten film, and there has been no attempt to cause germanium to be contained intentionally to take advantage of useful characteristics of the tungsten germanium compound. Moreover, no tungsten germanium compound film where a germanium/tungsten composition ratio exceeds 0.18 has been realized.

According to Non Patent Literature 3, a theoretical calculation has been performed on one cluster, but no tungsten germanium compound film has been realized and no characteristic of a tungsten germanium compound film having a germanium/tungsten composition ratio exceeding 0.18 is known.

Next, problems of a semiconductor device using germanium will be described. The semiconductor device using germanium includes a contact section between germanium and a metal electrode. In this contact section, an energy barrier called a "Schottky barrier" is formed in a junction interface, which may be a factor inhibiting electrical conduction. In the contact section between conventional n-type germanium and the metal electrode, an energy barrier as high as that in a germanium band gap is formed. To realize a semiconductor device using germanium having good electric characteristics, the energy barrier needs to be reduced.

The present invention has been implemented to solve these problems and it is an object of the present invention to provide a compound film of tungsten and germanium. It is another object of the present invention to provide a semiconductor device provided with a compound film of tungsten and germanium useful for the semiconductor device. It is a further object of the present invention to provide a method and an apparatus for manufacturing a compound film of tungsten and germanium.

Solution to Problem

In order to achieve the above-described objects, the present invention includes the following features.

(1) A compound film of tungsten and germanium having a germanium/tungsten composition ratio of 0.2 or more and less than 6, including an optical energy gap.

(2) The compound film of tungsten and germanium described in (1) having the germanium/tungsten composition ratio of 1 or more and 3.2 or less.

(3) A semiconductor device provided with the compound film of tungsten and germanium described in (1) or (2).

(4) The semiconductor device described in (3) having a stack structure of a semiconductor substrate and the compound film of tungsten and germanium.

(5) The semiconductor device described in (4) having a stack structure in which the semiconductor substrate, the compound film of tungsten and germanium and a metal electrode are laminated in this order.

(6) A semiconductor device having a stack structure in which a semiconductor substrate, a compound film of tungsten and germanium having a germanium/tungsten composition ratio of 1 or more and 3.2 or less and a metal electrode are laminated in this order.

(7) The semiconductor device described in any one of (4) to (6), in which the semiconductor substrate is any one of a germanium substrate, a silicon substrate and a silicon germanium substrate.

(8) A method for manufacturing the compound film of tungsten and germanium described in (1), the method including causing a material gas of tungsten to chemically react with a material gas of germanium in at least one of a region in a gas phase and a region on a substrate and thereby producing a compound of tungsten and germanium on the substrate.

(9) The method for manufacturing the compound film of tungsten and germanium described in (8), including keeping the material gas of tungsten and the material gas of germanium at a temperature of 120° C. or more and 270° C. or less.

(10) An apparatus for manufacturing a compound film of tungsten and germanium by supplying a material gas of tungsten and a material gas of germanium, causing the material gas of tungsten to chemically react with the material gas of germanium in at least one of a region in a gas phase and a region on a substrate and thereby producing a compound of tungsten and germanium, the apparatus including a heating mechanism to keep the material gas of tungsten and the material gas of germanium at a temperature of 120° C. or more and 270° C. or less.

Advantageous Effects of Invention

The present invention can realize a compound of tungsten and germanium, having a germanium/tungsten composition ratio of 0.2 or more and less than 6 as a film for the first time and realize a useful compound film having an optical energy gap.

Since the optical energy gap changes depending on a germanium/tungsten composition ratio, it is possible to obtain a film with a desired characteristic according to the purpose of use by selecting a composition ratio as appropriate.

The present invention has a large optical energy gap of 0.12 eV or more when the germanium/tungsten composition ratio is 1 or more and 3.2 or less, and so the present invention is more preferable as a compound film.

Using the compound film of tungsten and germanium of the present invention as an interposing layer between the electrode layer and the semiconductor layer in the electrode stack structure improves the electrical characteristics of the semiconductor device having the electrode stack structure.

The manufacturing method of the present invention is suitable for area enlargement of the substrate and simultaneous processing of a plurality of substrates and provides excellent controllability and uniformity of the film thickness and covering property for step features or the like, and so the manufacturing method of the present invention is advantageous to industrial manufacturing of LSIs or displays for which refining, integration, or area enlargement are important factors.

DESCRIPTION OF EMBODIMENTS

Figure 1:
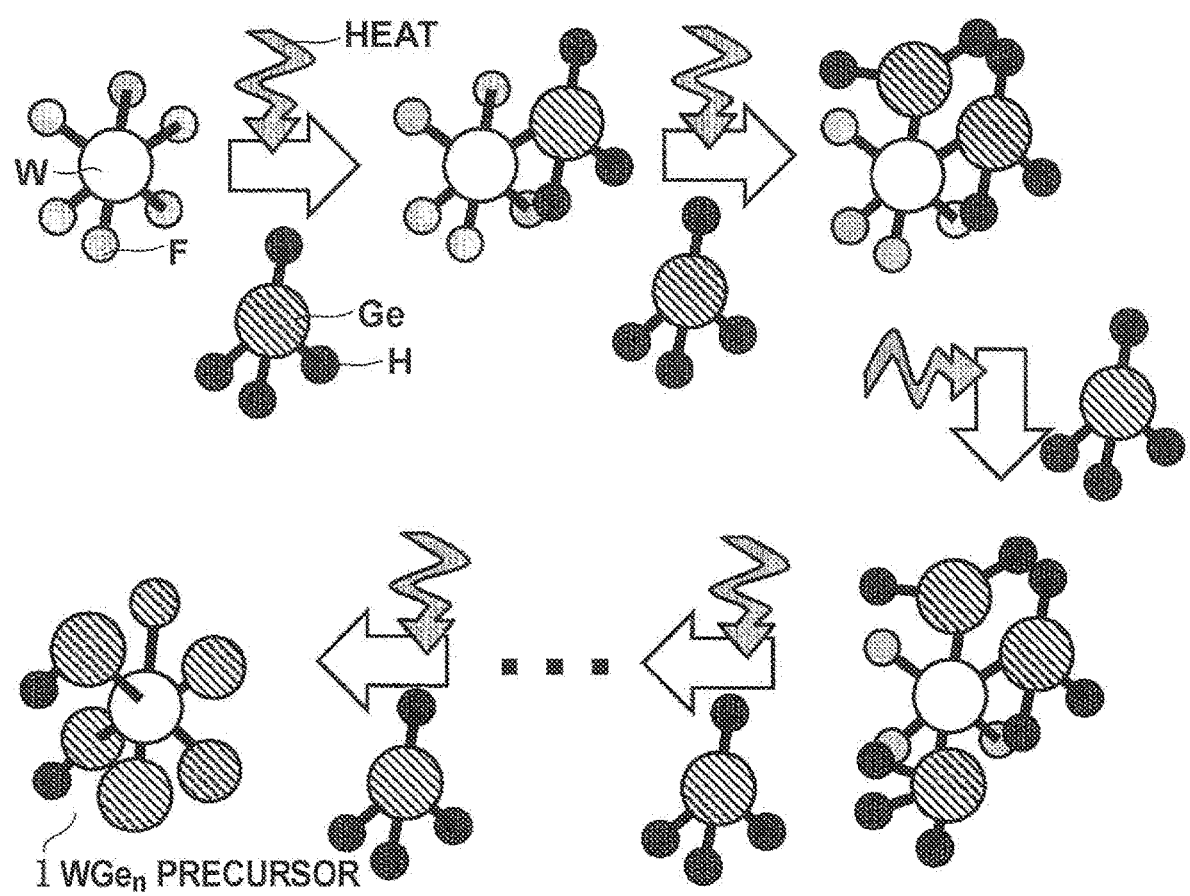
FIG. 1 is a schematic view illustrating a reaction process between $GeH_4$ and $WF_6$ in a gas phase according to a first embodiment.

Hereinafter, embodiments of the present invention will be described.

Embodiments of the present invention relate to a compound film of tungsten and germanium having a germanium/tungsten composition ratio of 0.2 or more and less than 6.

The compound film of the present embodiment includes an optical energy gap. In the embodiment of the present invention, the compound of tungsten and germanium having a germanium/tungsten composition ratio of 0.2 or more and less than 6 is described as a $WGe_n$ film (where, $0.2 \leq n < 6$).

In the $WGe_n$ film (where, $0.2 \leq n < 6$) of the embodiment of the present invention, the optical gap is 0.01 eV or more and 0.33 eV or less.

Here, the optical energy gap (hereinafter also referred to as an "optical gap") refers to an energy gap calculated from wavelength dependency of an optical absorption characteristic of a thin film. Particularly, an energy gap calculated using the following equation (Equation 1) is targeted.

$$(\alpha E)^{1/2} = A(E - E_0) \qquad \text{(Equation 1)}$$

Here, $\alpha$ is an optical absorption coefficient, E is photon energy, $E_0$ is an optical energy gap and A is a constant. As a method for calculating an optical energy gap using Equation 1, for example, photon energy dependency of the optical absorption coefficient is calculated from optical absorption measurement of the compound film, square roots (vertical axis) of the product of the optical absorption coefficient and the photon energy with respect to the photon energy (horizontal axis) are plotted and points of intersection of tangents and the horizontal axis of the plots are calculated as optical energy gaps. Such plots are called "Tauc plots" and the optical energy gap calculated in this way is also called a "Tauc gap" (see Non Patent Literature 5).

To manufacture the $WGe_n$ film of the embodiments of the present invention, methods according to first and second embodiments are available. The first method is one whereby a material gas of tungsten and a material gas of germanium are supplied, the material gases of tungsten and germanium are made to chemically react with each other in a gas phase to produce precursors, and the precursors are deposited on the substrate or below the metal electrode to produce a $WGe_n$ film. The second method is one whereby the material gas of tungsten and the material gas of germanium are supplied, the material gases of tungsten and germanium are made to chemically react with each other, not in a gas phase but on the substrate to produce a $WGe_n$ film. Furthermore, the first and second methods may be combined to cause the material gases of tungsten and germanium to chemically react with each other in the gas phase and on the substrate.

As the material gas of tungsten, at least any one of a gas composed of fluorine and tungsten, a gas composed of chlorine and tungsten and a gas composed of an organic matter and tungsten may be preferably used. Furthermore, as the material gas of germanium, at least any one of monogermane composed of hydrogen and germanium, a gas composed of chlorine and germanium and a gas composed of an organic matter and germanium may be preferably used.

In order to control the composition ratio n of the $WGe_n$ film, it is preferable to control the pressure of the germanium material gas within a range of 0.1 or more and 2000 Pa or less in the film forming chamber. By causing the germanium material gas to collide with the tungsten material gas in the gas phase to thereby undergo a chemical reaction, forming precursors of the $WGe_n$ film and repeating collision between the precursors and the germanium material gas, the Ge/W composition ratio of the precursors increases. An increase in the pressure of the germanium material gas causes the number of collisions between the germanium material gas and the precursors to increase, increasing chances the germanium material gas chemically reacts with the precursors and thereby increasing the Ge/W composition ratio of the precursor. Therefore, there is a positive correlation between the pressure of the germanium material gas and the Ge/W composition ratio n of the $WGe_n$ film. To control the composition of the $WGe_n$ film with high accuracy, it is preferable to control the gas pressure and the gas temperature. A semiconductor such as Si or Ge, an insulator such as quartz, sapphire or resin, and a metal can be used for the substrate.

For the manufacturing apparatus for manufacturing the $WGe_n$ film according to the embodiment of the present invention, it is preferable to dispose a heating mechanism in one or more of an external wall, internal wall of the film forming chamber, a deposited substrate in the film forming chamber and a support mechanism of the deposited substrate. In order to heat the material gases, it is particularly preferable to adopt a structure with a heating mechanism attached to an internal wall or an external wall of the film forming chamber. In order to heat the material gases, it is preferable to adopt a structure with the heating mechanism attached to the internal wall or the external wall of a gas introducing pipe. Furthermore, for a chemical reaction to take place on the substrate, it is preferable to adopt a structure with a heating mechanism attached to the deposited substrate.

First Embodiment

The tungsten germanium compound film according to a first embodiment of the present invention will be described with reference to the accompanying drawings.

First, a method for manufacturing a tungsten germanium compound film will be described. To manufacture the tungsten germanium compound film, $WF_6$ and $GeH_4$ are used as material gases. The material gas is heated within a range of 120° C. or more and 270° C. or less using a heater disposed on the wall of the film forming chamber to cause $WF_6$ to react with $GeH_4$ in a gas phase and synthesize $WGe_n$ (n=0.2 to 6) which becomes a precursor of the tungsten germanium compound. When heated at a temperature lower than 120° C., $WF_6$ does not react with $GeH_4$. Furthermore, when heated at a temperature higher than 270° C., $GeH_4$ molecules react with one another and an amorphous germanium film is formed.

FIG. 1 is a schematic view illustrating a reaction process between $GeH_4$ and $WF_6$. As shown at top left, $GeH_4$ collides and reacts with $WF_6$ in the gas phase first (top left), then a precursor $WGe_n$ repeatedly collides with $GeH_4$ as shown by arrows sequentially, whereby Ge enrichment, that is, an increase in the n value advances. It is possible to promote reactions by providing assistance with thermal energy in collision.

Figure 2:
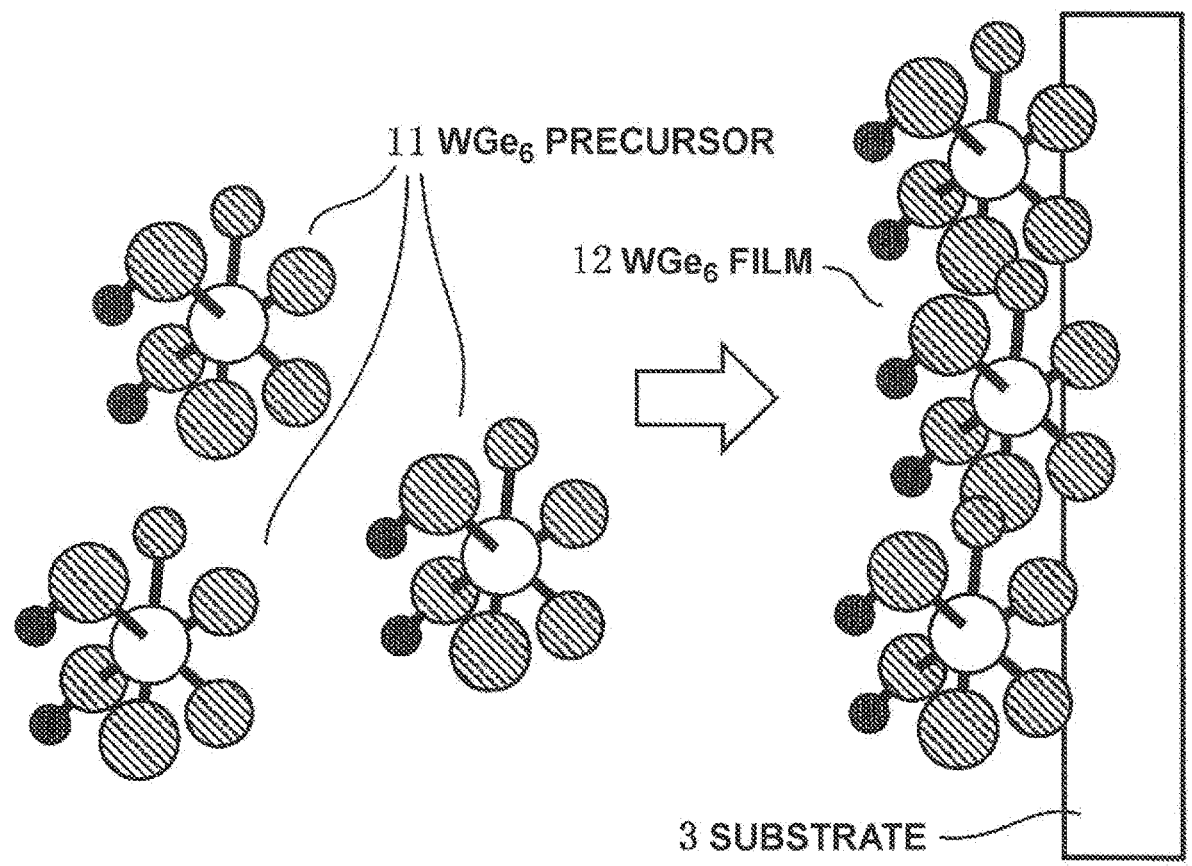
FIG. 2 is a schematic view illustrating a process of producing a thin film of a tungsten germanium compound having a Ge/W composition ratio of 6, on a substrate by aggregating precursors $WGe_6$ according to the first embodiment.

FIG. 2 is a schematic view illustrating a process of producing a thin film of a tungsten germanium compound having a Ge/W composition ratio of 6, on a substrate by aggregating precursors $WGe_6$. As shown in this drawing, the $WGe_n$ precursors synthesized in a gas phase are deposited on a substrate surface and a thin film of the tungsten germanium compound is deposited. At this time, if the substrate is heated within a range of 120° C. or more and 270° C. or less, it is possible to promote the aggregation of the $WGe_n$ precursors. When heated at a temperature lower than 120° C., $WF_6$ and $GeH_4$ do not aggregate with each other well. On the other hand, when heated at a temperature higher than 270° C., $GeH_4$ molecules react with one another, forming an amorphous germanium film.

The present manufacturing method is similar to the manufacturing method for the tungsten silicon compound film shown in Non Patent Literature 4, in that $WF_6$ is used as the material gas and thermal energy is used to cause a reaction between the material gases, whereas the present manufacturing method is different in that since it corresponds to manufacturing of a tungsten germanium compound film, it is different in use of $GeH_4$ as the material gas and in the range of manufacturing temperature. The present invention can produce the film at a temperature lower than that in the manufacturing method described in Non Patent Literature 4. The low-temperature process of the present invention is advantageous in securing performance of an electronic device when producing the electronic device.

Since hydride or fluoride is used as the material gas according to the present manufacturing method, hydrogen or fluorine may be contained in the film formed as an impurity. The hydrogen or fluorine can be dissociated through heat treatment on the film. The dissociated substances can be identified through mass spectrometry of the dissociated substances from the film under heat treatment.

Figure 3:
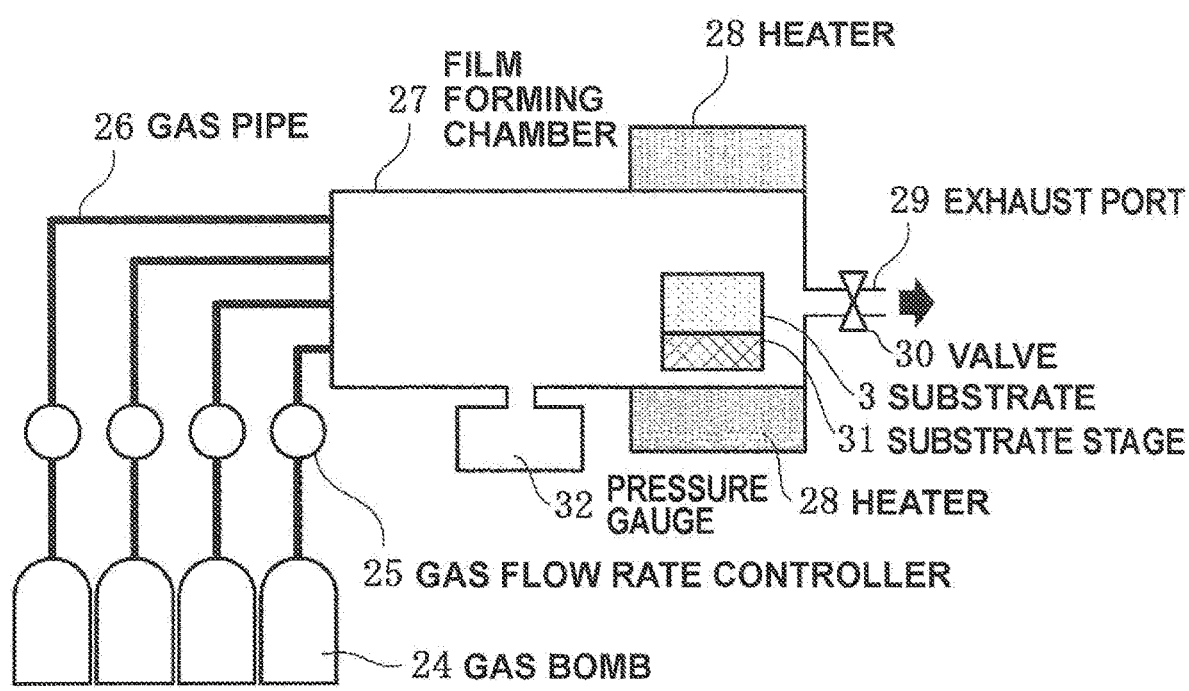
FIG. 3 is a schematic view of a manufacturing apparatus for producing a compound film of tungsten and germanium according to the first embodiment.

FIG. 3 is a schematic view of a manufacturing apparatus according to the present embodiment. The manufacturing apparatus is provided with a film forming chamber 27 in which a material gas of tungsten reacts with a material gas of germanium, gas pipes 26 to introduce the material gas of tungsten and the material gas of germanium, a gas flow rate control mechanism such as a gas flow rate controller 25 to control the flow rate of at least one of the material gas of tungsten and the material gas of germanium, a gas pressure control mechanism (pressure gauge 32, valve 30) to control pressures of the material gas of tungsten and the material gas of germanium, an exhaust mechanism (exhaust port 29) to exhaust the unreacted material gases of tungsten and germanium, a substrate 3 to deposit precursors in the film forming chamber 27, and a substrate stage 31 with a heater to support and move the substrate. In FIG. 3, a heater 28 is disposed on the external wall of the film forming chamber 27. The heater 28 has a function of heating a gas in the film forming chamber 27. With the heater disposed on the wall of the film forming chamber, it is possible to efficiently promote reactions in the gas phase in the embodiment in FIG. 1. Furthermore, when the substrate is disposed between the gas inlet port and the exhaust port, the $WGe_n$ precursors can be deposited on the substrate efficiently. By disposing a heating mechanism also on the substrate stage 31, it is possible to assist an increase in a gas temperature and promote germanium enrichment of the film. The manufacturing apparatus is provided with a plurality of gas bombs 24 to store material gases and an atmosphere gas (diluent gas) respectively, and the material gases and the atmosphere gas are introduced into the film forming chamber 27 via the gas pipes 26, respectively. For example, $GeH_4$ and $WF_6$ are used as the material gases. Chlorine-based gases such as $Ge_2H_6$ or $GeCl_4$ may be used as the Ge material and a chloride-based gas such as $WCl_6$ can also be used as the W material. Furthermore, Ar or $H_2$ gas may also be used as the diluent gas. As illustrated, gases are supplied from the plurality of gas bombs ($WF_6$, $GeH_4$, Ar and $H_2$ from the left in FIG. 3). With the gas flow rate controllers 25 disposed on the way of the gas pipes 26, the flow rates of the gases introduced into the film forming chamber 27 are controlled. The pressure in the film forming chamber 27 is controlled by checking the pressure using the pressure gauge 32 disposed in the film forming chamber 27 and adjusting a diaphragm of the valve 30 disposed at the exhaust port 29 to exhaust the gas (indicated by an arrow in FIG. 3). In order for a gas phase reaction to take place between $GeH_4$ and $WF_6$ in the film forming chamber, it is necessary to secure a sufficient reaction space and it is preferable that the gas exhaust port 29 be sufficiently distanced from the gas inlet port and the film forming chamber have a sufficient capacity. Providing a large reaction space allows a sufficient gas phase reaction to take place in the film forming chamber.

Figure 4:
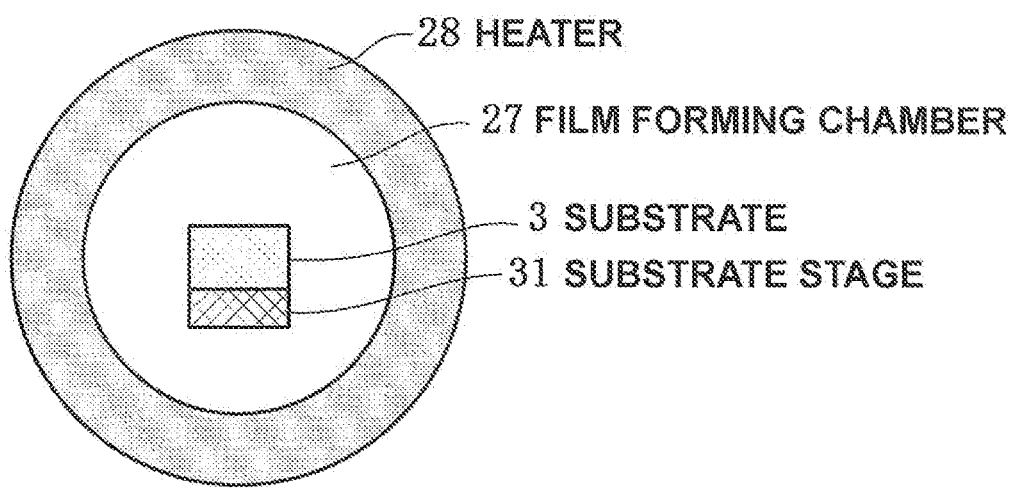
FIG. 4 is a cross-sectional schematic view of a film forming chamber of the manufacturing apparatus in FIG. 3 viewed from a gas inlet port side.

FIG. 4 is a cross-sectional schematic view of the film forming chamber of the manufacturing apparatus in FIG. 3 viewed from the gas inlet port side. In FIG. 4, the heater 28 is disposed on the external wall of the film forming chamber 27, and disposing the substrate 3 in the center of the film forming chamber 27 makes it possible to uniformize a gas phase temperature and efficiently deposit the $WGe_n$ precursors on the substrate.

Second Embodiment

The present embodiment will describe a case where the compound film is manufactured through only reactions on the substrate surface.

Figure 5:
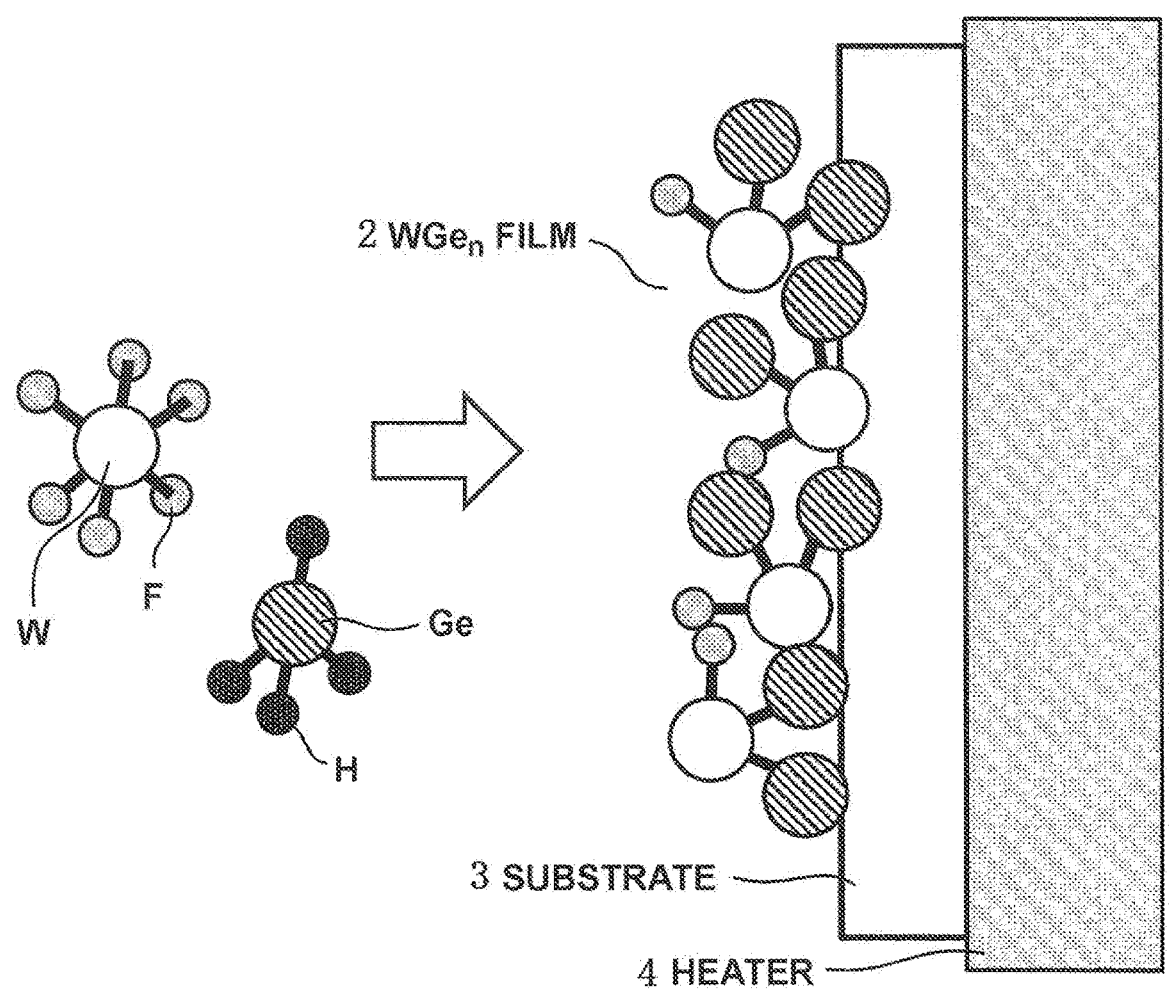
FIG. 5 is a schematic view illustrating a reaction process between $GeH_4$ and $WF_6$ on the substrate surface according to the second embodiment.

FIG. 5 is a schematic view illustrating a reaction process between $GeH_4$ and $WF_6$ on the substrate surface. As shown in FIG. 5, a thin film of a tungsten germanium compound can be produced without using any reaction in the gas phase according to the first embodiment. At this time, when the substrate 3 is heated within a range of 120° C. or more and 270° C. or less using a heater 4 or the like, it is possible to prompt the aggregation of $WGe_n$ precursors. Furthermore, heating the substrate 3 at a temperature lower than 120° C. causes $WF_6$ and $GeH_4$ not to aggregate with each other well. On the other hand, heating the substrate 3 at a temperature higher than 270° C. causes $GeH_4$ molecules to react with one another, forming an amorphous germanium film.

Figure 6:
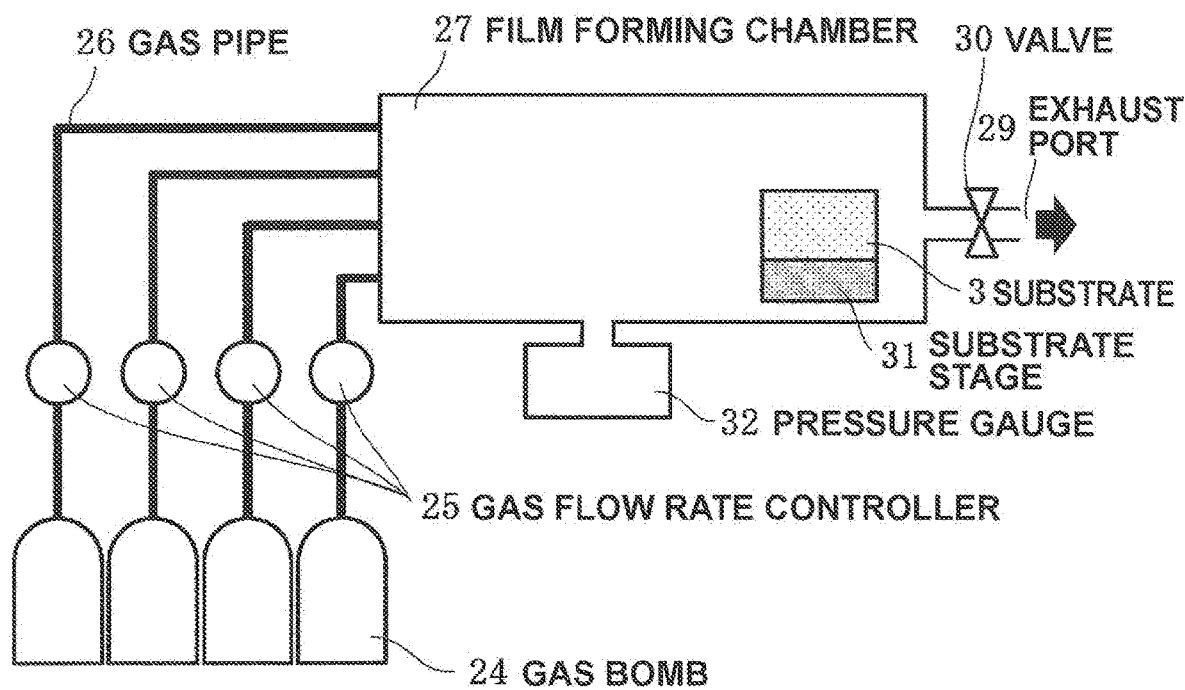
FIG. 6 is a schematic view of a manufacturing apparatus for producing a compound film of tungsten and germanium according to the second embodiment.

FIG. 6 is a schematic view of the manufacturing apparatus according to the present embodiment. Compared to the apparatus in FIG. 3, the manufacturing apparatus in FIG. 6 is different in that no heater is disposed on the external wall of the film forming chamber. The heater is not disposed on the wall of the film forming chamber because the $WGe_n$ precursors are thereby deposited on the substrate efficiently and if the wall of the film forming chamber is heated by the heater, the $WGe_n$ precursors are deposited on the wall of the film forming chamber. The substrate 3 to deposit precursors and the substrate stage 31 with the heater are disposed in the film forming chamber 27.

Third Embodiment

The present embodiment will describe a structure in which a tungsten germanium compound film is applied to a semiconductor device with reference to the accompanying drawings.

Figure 7:
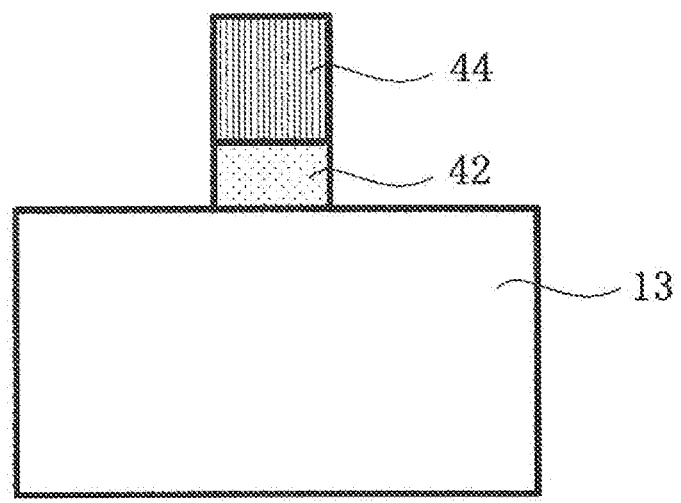
FIG. 7 is a cross-sectional schematic view describing a semiconductor device in which the compound film of tungsten and germanium according to a third embodiment is used for an electrode structure.

FIG. 7 is a cross-sectional schematic view of a semiconductor device in which the tungsten germanium compound film is used for an electrode structure. This is a stack structure in which the tungsten germanium compound is interposed in a contact interface between a semiconductor substrate and a metal electrode. As shown in FIG. 7, the semiconductor device of the present embodiment has a structure including a $WGe_n$ film 42 which is a compound of tungsten and germanium on a semiconductor substrate 13 and a metal electrode 44 thereon. In contrast to a conventional semiconductor device where the metal electrode is directly in contact with the semiconductor substrate, the stack structure according to the embodiment of the present invention makes it possible to reduce contact resistance between the metal electrode and the semiconductor substrate.

Figure 8:
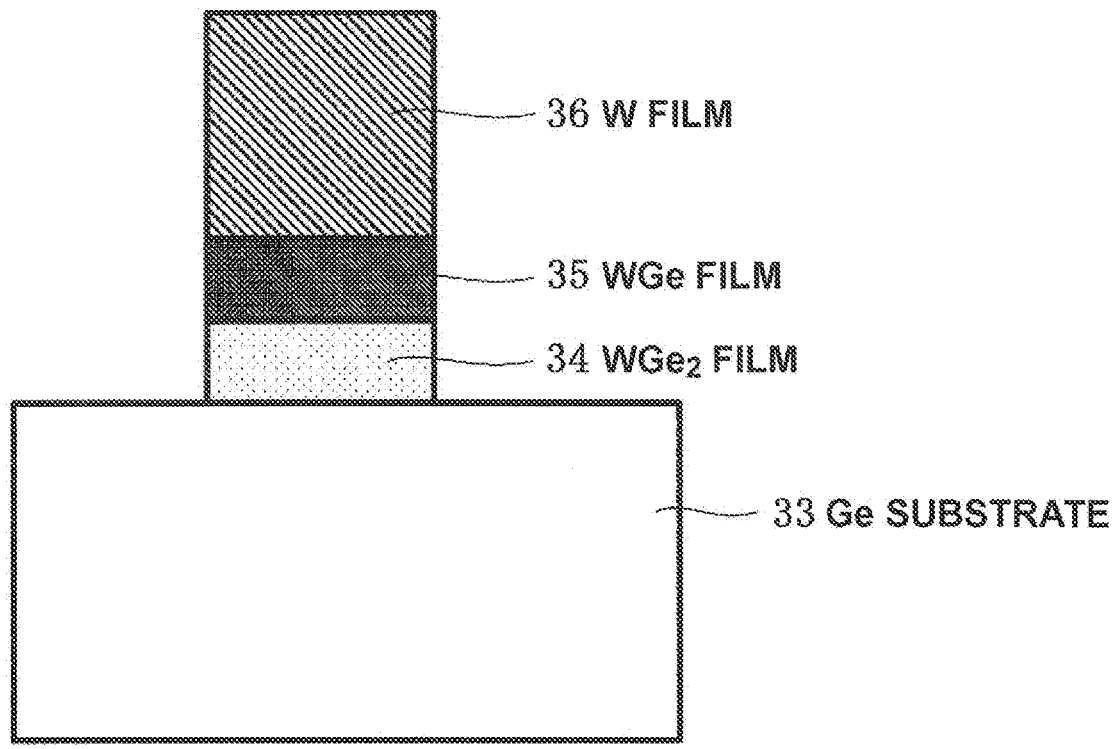
FIG. 8 is a cross-sectional schematic view describing a case where a compound film of tungsten and germanium with composition gradient is used for the electrode structure according to the third embodiment.

FIG. 8 is a cross-sectional schematic view of a semiconductor device in which a tungsten germanium compound film with composition gradient is used for the electrode structure. As shown in FIG. 8, when a Ge substrate 33 is used for the semiconductor substrate and a W film 36 is used for the metal electrode in the embodiment in FIG. 7, it is effective to cause the composition of the tungsten germanium compound to have a structure in which there is composition gradient from the substrate side in a stepwise manner in order of a $WGe_2$ film 34 and a WGe film 35 or in a continuous manner. By causing the composition ratio to incline and change from the semiconductor substrate to the metal in phases or continuously, it is possible to change an energy barrier in phases or continuously and thereby provide an effect of being able to reduce parasitic resistance caused by the energy barrier. In terms of manufacturing, there is also an advantage of being able to produce the tungsten germanium compound film to the W film continuously using the same manufacturing apparatus.

FIG. 9 to FIG. 13 illustrate a structure peculiar to a semiconductor device using the $WGe_n$ film structure in FIGS. 1 and 2.

Figure 9:
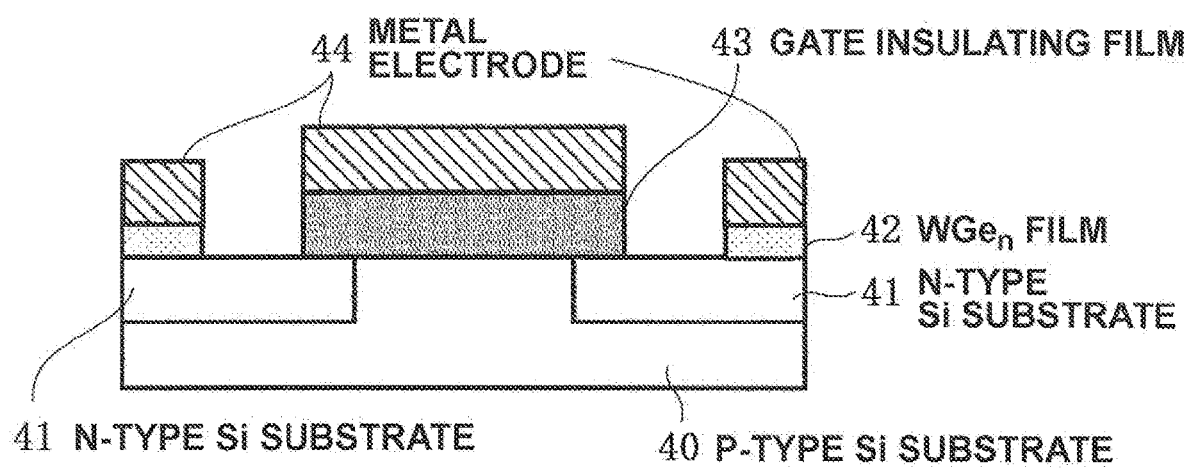
FIG. 9 is a cross-sectional schematic view of an N-MOS transistor according to the third embodiment.

FIG. 9 is a cross-sectional schematic view of an N-MOS transistor. FIG. 9 has a source/drain structure with a $WGe_n$ film 42 inserted into a contact interface between a metal electrode 44 and a semiconductor substrate (N-type Si substrate 41). Note that a central part in FIG. 9 is a gate structure with a gate insulating film 43 and a gate electrode (metal electrode 44) laminated on a P-type Si substrate 40. Using the $WGe_n$ film (e.g., $0.2 \le n < 6$) having a high Ge composition ratio n makes it possible to reduce defect levels generated in the contact interface between the Si substrate and the $WGe_n$ film, control the height of the energy barrier generated between the metal and the Si substrate and reduce the contact resistance of the metal/Si substrate. The electrode structure provided with the $WGe_n$ film is effective not only for an N-MOS transistor but also for a P-MOS transistor or effective not only for a Si transistor but also for a Ge transistor.

Figure 10:
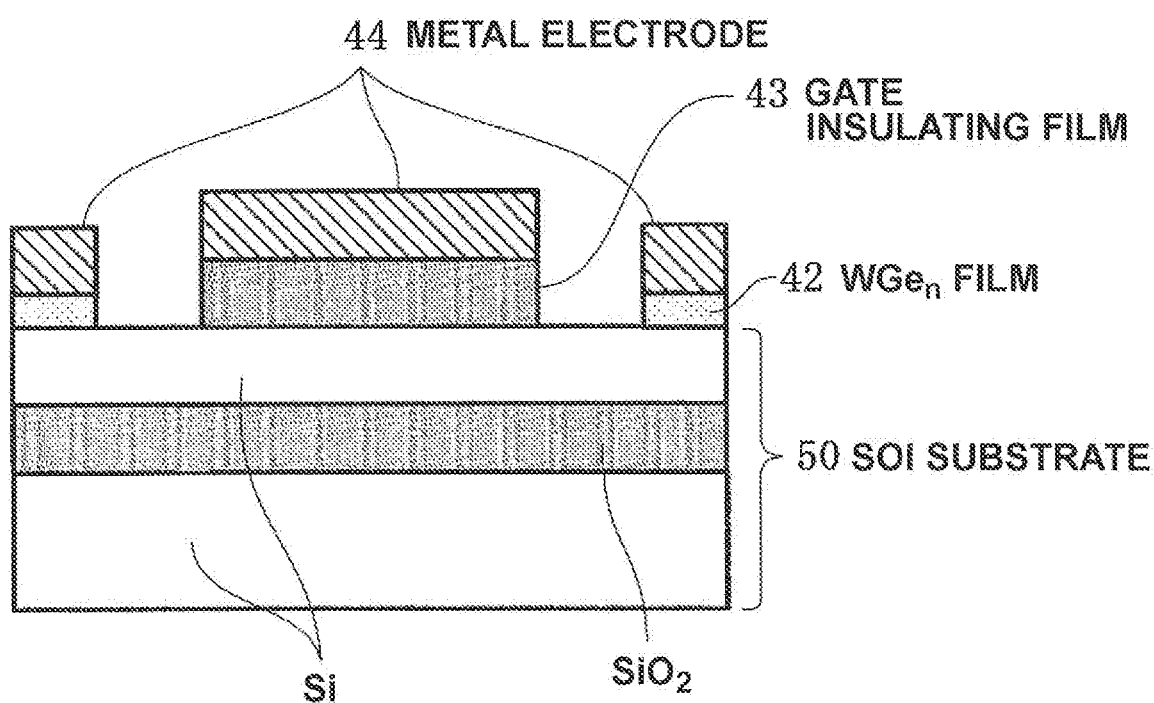
FIG. 10 is a cross-sectional schematic view of a non-junction type transistor having a source/drain structure using an SOI substrate according to the third embodiment.

FIG. 10 is a cross-sectional schematic view of a non-junction type transistor having a source/drain structure using an SOI substrate. FIG. 10 is a cross-sectional schematic view of a non-junction type transistor having a source/drain structure in which the $WGe_n$ film 42 is inserted into a contact interface between the metal electrode 44 and a silicon on insulator (SOI) substrate 50 composed of Si and $SiO_2$. Unlike the transistor in FIG. 9, no PN junction is formed through doping in the source/drain region. Since the channel and the source/drain region have the same dopant concentration, this is effective in reducing variations in transistor characteristics. Reducing the dopant concentration is particularly effective in reducing drain-induced barrier lowering (DIBL) which is one of short channel effects. However, when the dopant concentration is low, the contact resistance between the metal and the SOI substrate increases. By inserting the $WGe_n$ film into the contact interface between the metal and the SOI substrate, it is possible to control the height of the energy barrier generated between the metal and the SOI substrate and reduce the contact resistance between the metal and the SOI substrate.

Figure 11:
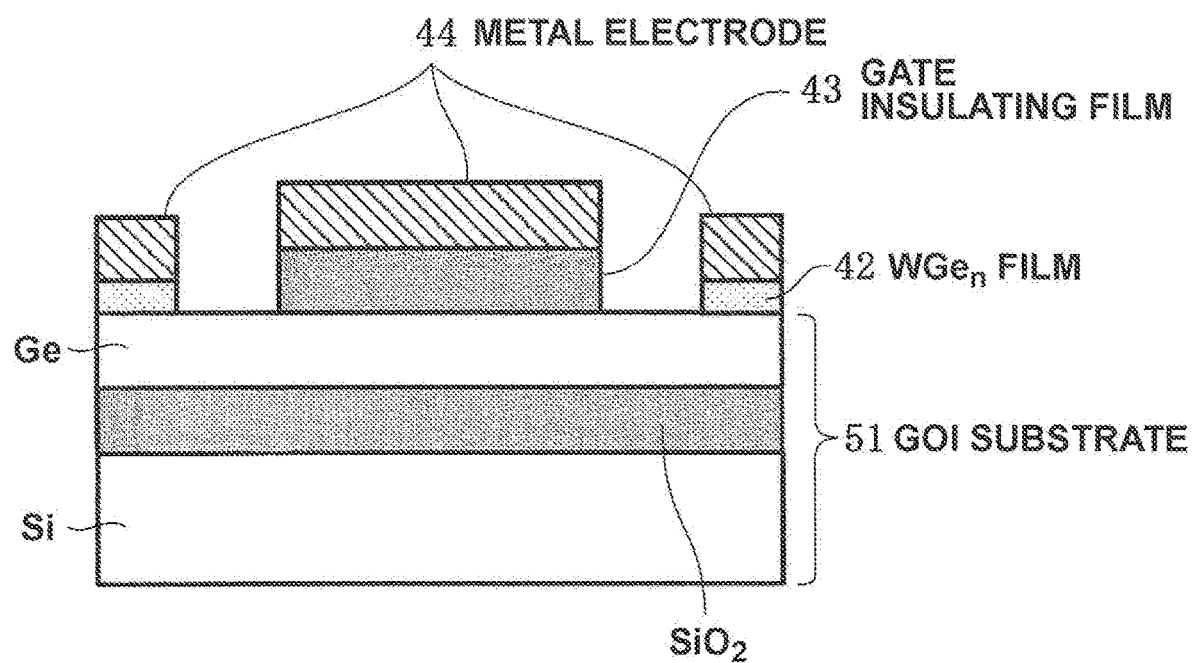
FIG. 11 is a cross-sectional schematic view of a non-junction type transistor having a source/drain structure using a GOI substrate according to the third embodiment.

FIG. 11 is a cross-sectional schematic view of a non-junction type transistor having a source/drain structure using a germanium on insulator (GOI) substrate instead of the SOI substrate in FIG. 10.

Figure 12:
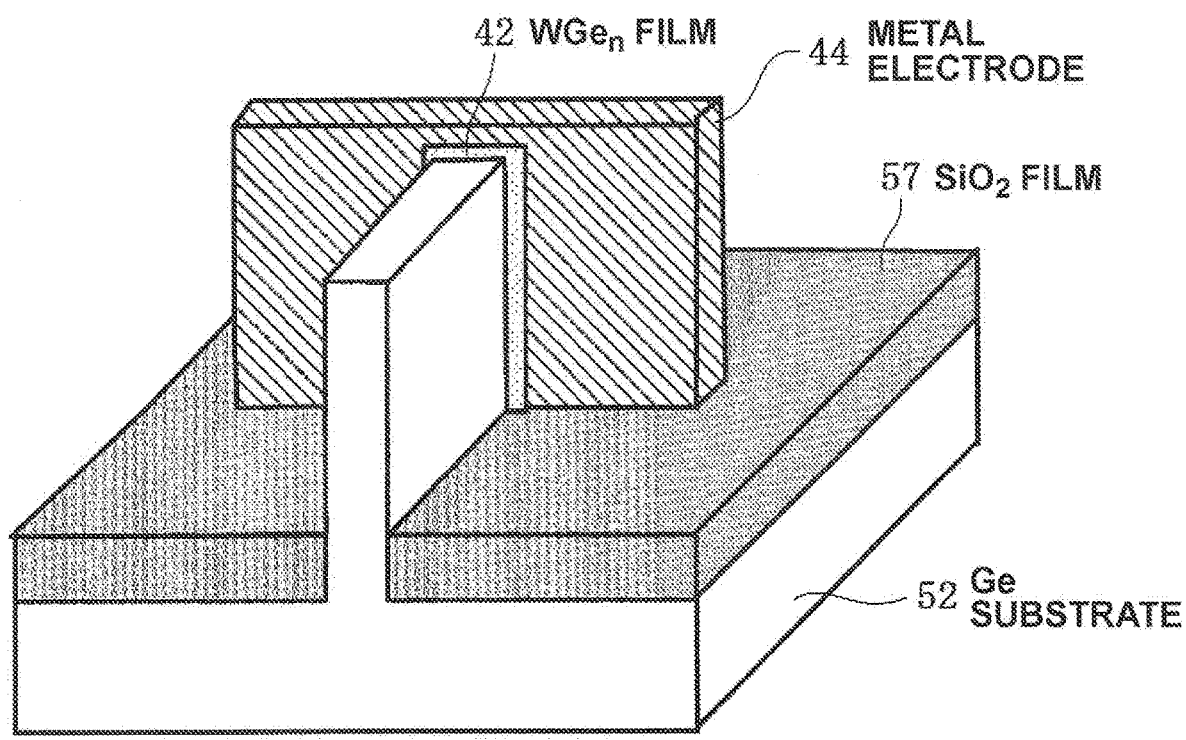
FIG. 12 is a bird's eye view of main parts illustrating a source/drain region of a stereoscopic transistor according to the third embodiment.

FIG. 12 is a bird's eye view of main parts illustrating a source/drain region of a stereoscopic transistor. In FIG. 12, a vertically standing stereoscopic Ge structure is formed in part of a Ge substrate 52 with an $SiO_2$ film 57 provided on a surface thereof and the $WGe_n$ film 42 is provided between the side face of the Ge structure and the stereoscopic metal electrode 44. Since the $WGe_n$ film is formed through a gas phase reaction, the $WGe_n$ film has an excellent covering property and can be deposited on the stereoscopic structure uniformly.

Figure 13:
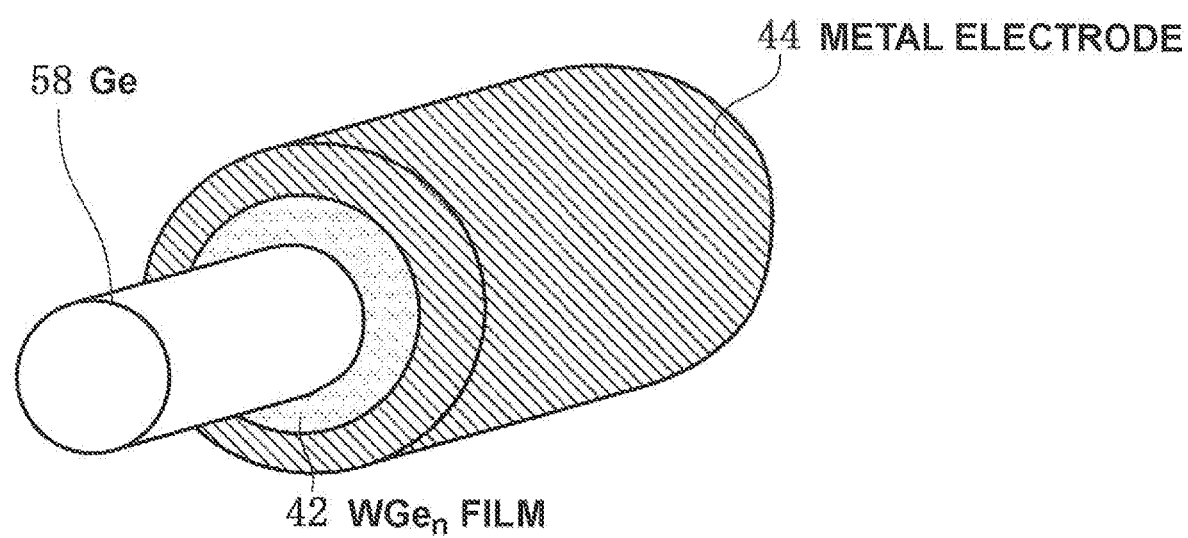
FIG. 13 is a bird's eye view of main parts illustrating the source/drain region of a nano-wire type transistor according to the third embodiment.

FIG. 13 is a bird's eye view of main parts illustrating the source/drain region of a nano-wire type transistor. In FIG. 13, an interposing layer made up of a $WGe_n$ film 42 is provided between a Ge wire 58 and a columnar metal electrode 44 surrounding the Ge wire 58. Since the $WGe_n$ film 42 is formed through a gas phase reaction, it has an excellent covering property and can be deposited on the stereoscopic structure uniformly.

Figure 14:
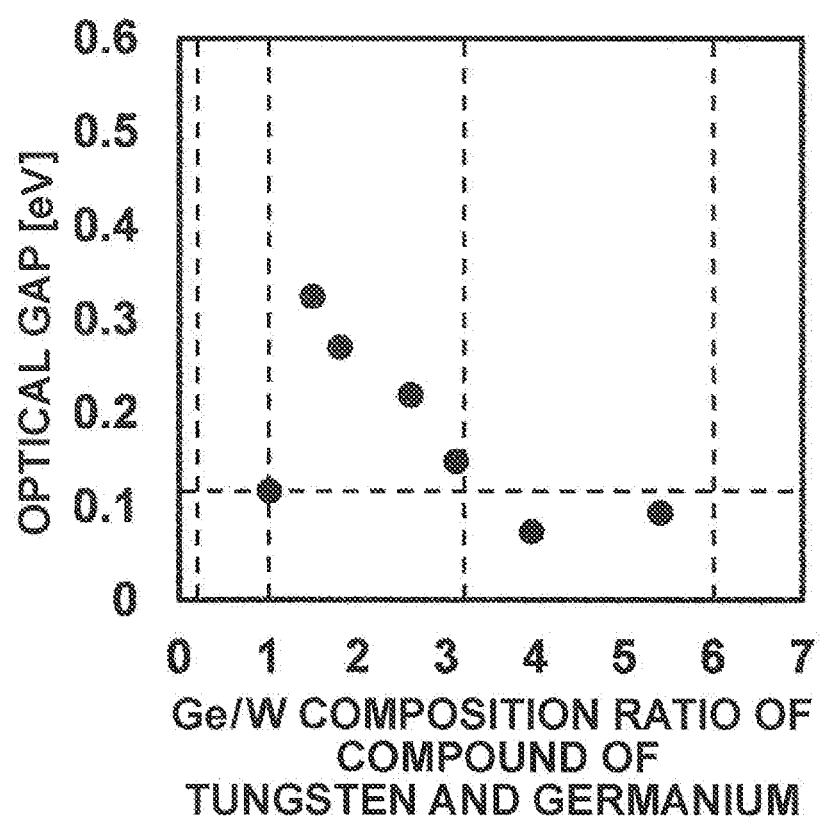
FIG. 14 is a diagram describing a relationship between a Ge/W composition ratio of the compound film of tungsten and germanium and an optical gap according to the third embodiment.

A tungsten germanium compound film can be produced within a range of a Ge/W composition ratio of smaller than 6. FIG. 14 is a diagram describing a relationship between a Ge/W composition ratio of a tungsten germanium compound produced and an optical gap. As shown in FIG. 14, the tungsten germanium compound film produced has (a Ge/W composition ratio of the tungsten germanium compound, the optical energy gap eV) of (1.01, 0.12) (1.49, 0.33) (1.80, 0.27) (2.60, 0.22) (3.11, 0.15) (3.97, 0.07) and (5.40, 0.09). It is apparent from FIG. 14 that the $WGe_n$ film (where, $0.2 \leq n < 6$) has an optical energy gap, and the optical energy gap is 0.01 eV or more and 0.33 eV or less. According to FIG. 14, when the Ge/W composition ratio of the tungsten germanium compound film is smaller than 0.2, the tungsten germanium compound film has metallic characteristics. When the Ge/W composition ratio is 1 or more and 3.2 or less, the tungsten germanium compound film has an optical gap of 0.12 eV or more. When the Ge/W composition ratio is 1.5, the optical gap exhibits a maximum value of 0.33 eV. Furthermore, according to FIG. 14, when the Ge/W composition ratio is 1.2 or more and 2.6 or less, the tungsten germanium compound film has an optical gap of 0.2 eV or more. Within a range where the Ge/W composition ratio is larger than 1.5, the optical gap decreases as the Ge/W composition ratio increases.

Figure 15:
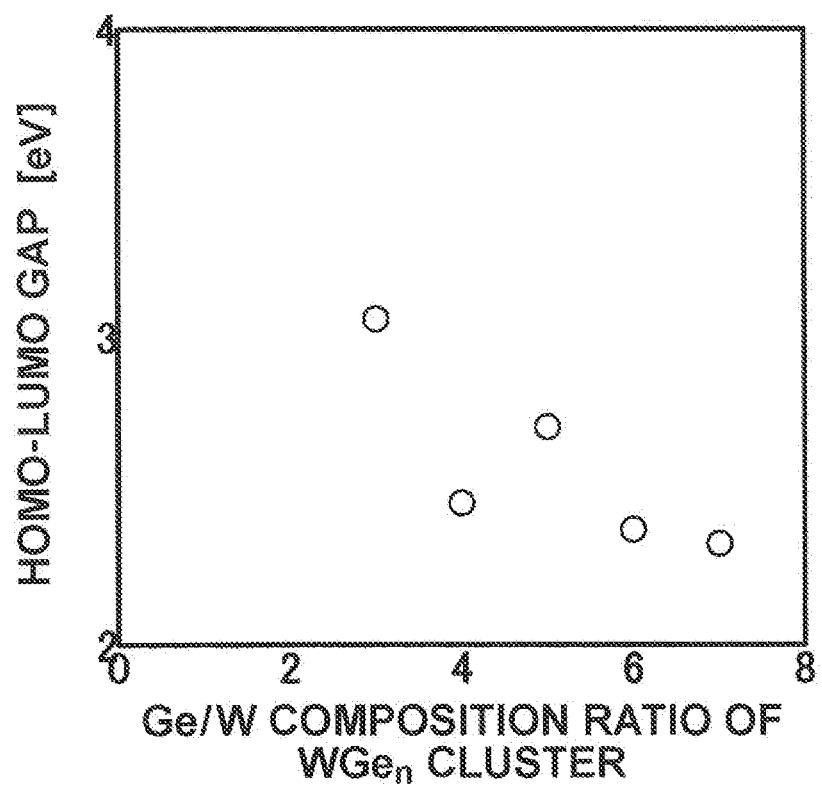
FIG. 15 is a diagram describing a relationship between a composition ratio of a tungsten germanium cluster and a HOMO-LUMO gap.

FIG. 15 is a diagram describing values of a composition ratio of one tungsten germanium cluster and a HOMO-LUMO gap obtained through theoretical calculations (see Non Patent Literature 3). The results shown in FIG. 14 can be verified from FIG. 15. In FIG. 15, when the Ge/W composition ratio of the tungsten germanium cluster increases, the HOMO-LUMO gap decreases. This tendency coincides with the result that the optical gap decreases as the Ge/W composition ratio of the tungsten germanium compound described in FIG. 14 increases. This result shows that the tungsten germanium compound film produced is constructed of a tungsten germanium cluster and the characteristics of the tungsten germanium compound film are determined by the characteristics of the tungsten germanium cluster.

An example where the tungsten germanium compound is actually produced by causing the composition ratio of the tungsten germanium compound to incline and decrease continuously from the semiconductor substrate to the metal will be described with reference to Table 1 and FIG. 16.

TABLE 1

| Number | Ge/W composition ratio of $WGe_n$ film in substrate interface | Schottkey barrier height (eV) |
|---|---|---|
| — | 0 | 0.58 |
| — | 0.5 | 0.58 |
| (1) | 1.9 | 0.46 |
| (2) | 2.4 | 0.46 |
| (3) | 3.3 | 0.58 |

Table 1 shows cases where the Ge/W composition ratio of the $WGe_n$ film in the substrate interface is 0, 0.5, 1.9 (sample number (1)), 2.4 (sample number (2)) and 3.3 (sample number (3)). FIG. 16 is a diagram describing a relationship between the Ge/W composition ratio of the tungsten germanium compound film on a Ge substrate and a distance from the substrate regarding (1) (2) and (3) respectively. The composition ratio of the tungsten germanium compound film decreases as the distance from the substrate increases. The Ge/W composition ratio of the outermost surface of the tungsten germanium compound film which is farthest from the substrate is on the order of 0.5.

Figure 16:
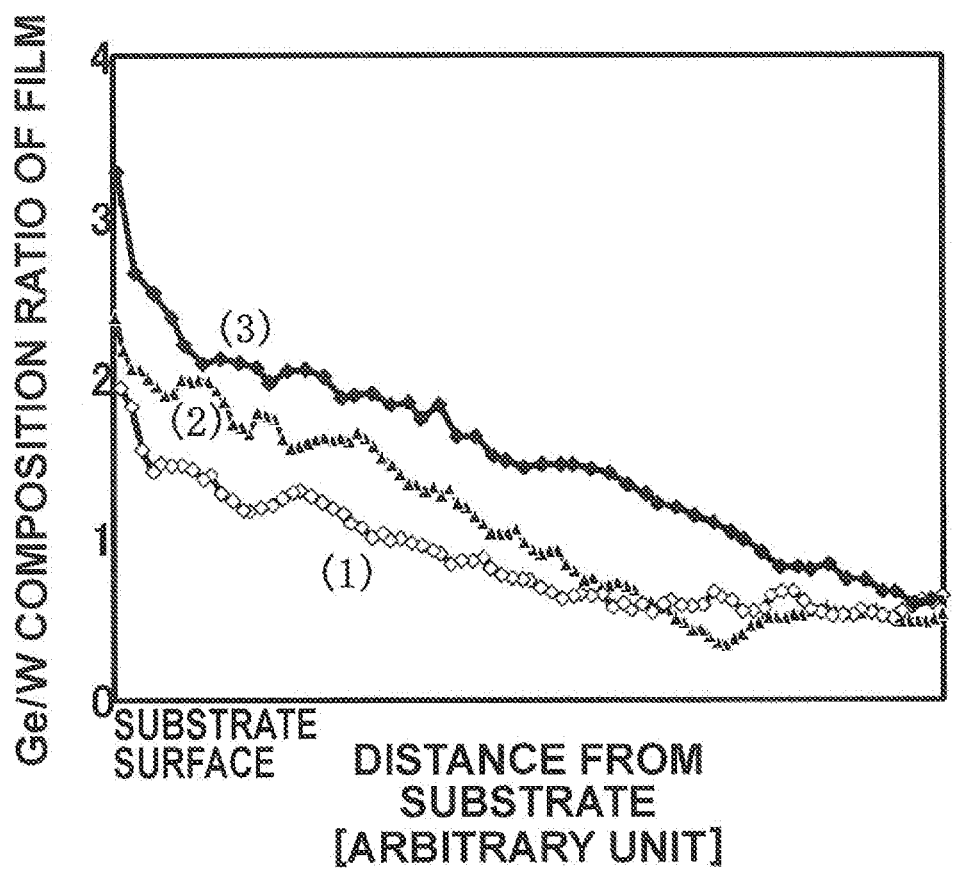
FIG. 16 is a diagram describing a relationship between a Ge/W composition ratio of a compound film of tungsten and germanium on a Ge substrate and a distance from the substrate according to the third embodiment.

Table 1 shows the relationship between the composition ratio of the tungsten germanium compound film in the substrate interface in FIG. 16 and the Schottky barrier height formed in the interface between the Ge substrate and the tungsten germanium compound film. When the composition ratio is 1.9 or 2.4, the Schottky barrier height shows a small value of 0.46 eV. For other composition ratios, the Schottky barrier height shows a large value of 0.58 eV. As shown in FIG. 14, when the composition ratio is 1.9 or 2.4, the optical gap of the tungsten germanium compound film shows a value greater than 0.12 eV. When the composition ratio is 0.5 or 3.3, the optical gap shows a value smaller than 0.12 eV. Therefore, the composition ratio of the tungsten germanium compound in the substrate interface determines the Schottky barrier height formed in the interface between the Ge substrate and the tungsten germanium compound.

Figure 17:
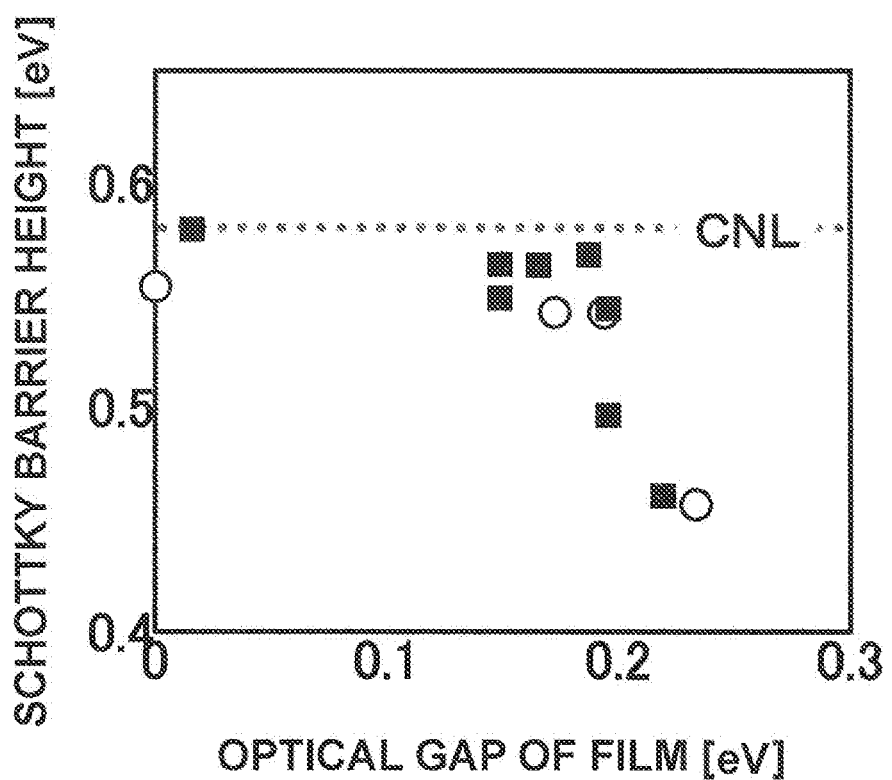
FIG. 17 is a diagram describing a relationship between an optical gap of the compound film of tungsten and germanium and a Schottky barrier height according to the third embodiment.

FIG. 17 is a diagram illustrating a relationship between the optical gap of the tungsten germanium compound film and the Schottky barrier height formed in the interface between the Ge substrate and the tungsten germanium compound film. CNL denotes a charge neutral level of Ge. A junction of a conventional metal electrode and Ge shows the Schottky barrier height close to this CNL. The difference between white circle and black rectangle plots represent a difference in a production condition of the tungsten germanium compound film. The white circle indicates a flow rate of $GeH_4/WF_6$ of 2/0.2 (SCCM) and the black rectangle indicates a flow rate of $GeH_4/WF_6$ of 2/0.05 (SCCM). Irrespective of the film forming condition, the Schottky barrier height decreases as the optical gap increases within a range of on the order of 0.12 eV or more or further a range of 0.2 eV or more. That is, FIG. 17 shows that the tungsten germanium compound film having a large optical gap is effective in achieving good junction characteristics.

Figure 18:
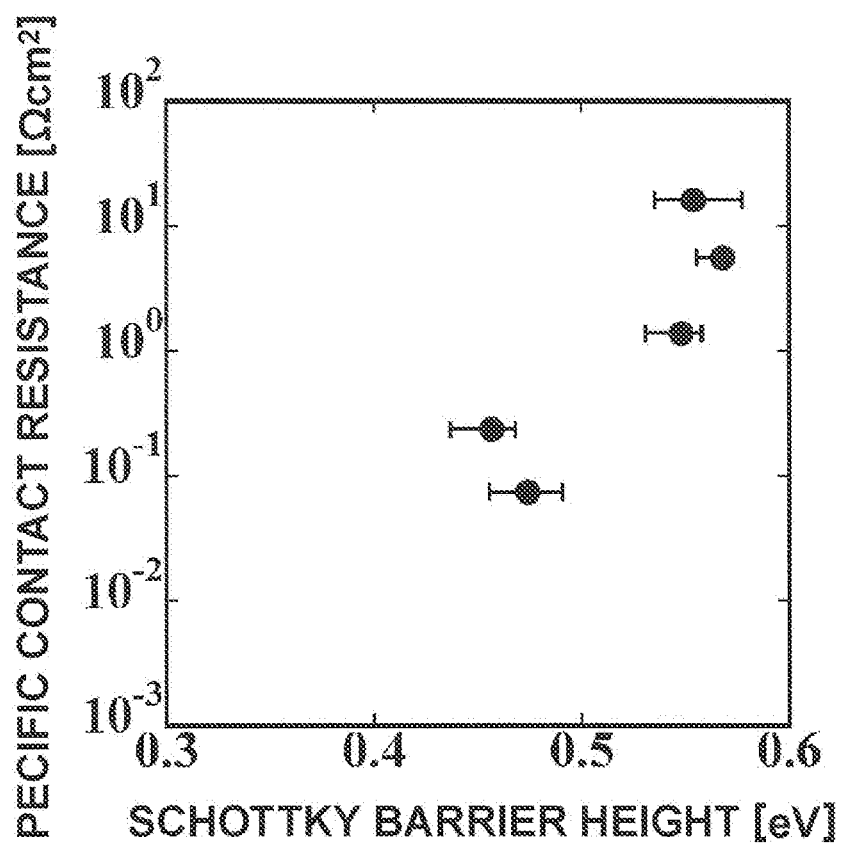
FIG. 18 is a diagram describing a relationship between a Schottky barrier height formed on a contact interface between the compound film of tungsten and germanium and a Ge substrate, and specific contact resistance according to the third embodiment.

FIG. 18 is a diagram describing a relationship between a Schottky barrier height formed on a contact interface between the tungsten germanium compound film and the Ge substrate, and specific contact resistance. As shown in FIG. 18, the contact resistance between the Ge substrate and the tungsten germanium compound film decreases as the height of the Schottky barrier decreases. This low contact resistance is effective for the semiconductor device shown in FIG. 9 to FIG. 13 to obtain excellent electric characteristics.

The substrate is effective not only for Ge but also for Si or SiGe. This is because the mechanism whereby a Schottky barrier is formed in the interface between a group-IV semiconductor and a tungsten germanium compound film is the same.

Note that the examples shown in the above-described embodiments or the like have been described to facilitate an understanding of the invention and the invention is not limited to the embodiments.

INDUSTRIAL APPLICABILITY

The film formed of the compound of tungsten and germanium of the present invention can realize a film having a desired optical energy gap according to a composition ratio, and is applicable to various types of semiconductor devices, and is industrially useful.

REFERENCE SIGNS LIST

1 $WGe_n$ precursor
2, 42 $WGe_n$ film
3 Substrate
4, 28 Heater
11 $WGe_6$ precursor
12 $WGe_6$ film
13 Semiconductor substrate
24 Gas bomb
25 Gas flow rate controller
26 Gas pipe
27 Film forming chamber
29 Exhaust port
30 Valve
31 Substrate stage
32 Pressure gauge
33, 52 Ge substrate
34 $WGe_2$ film
35 WGe film
36 W film
40 P-type Si substrate
41 N-type Si substrate
43 Gate insulating film
44 Metal electrode
50 SOI substrate
51 GOI substrate
57 $SiO_2$ film
58 Ge

The invention claimed is:

1. A compound film of tungsten and germanium formed by a tungsten/germanium compound consisting of tungsten and germanium, wherein
   the compound film of tungsten and germanium is created by aggregating precursors of the tungsten/germanium compound,
   the precursors of the tungsten/germanium compound are formed at a temperature of 120° C. or more and 270° C. or less,
   the compound film of tungsten and germanium has a germanium/tungsten composition ratio of 0.2 or more and less than 6, and
   the compound film of tungsten and germanium comprising comprises an optical energy gap.

2. The compound film of tungsten and germanium according to claim 1, having the germanium/tungsten composition ratio of 1 or more and 3.2 or less.

3. The semiconductor device comprising the compound film of tungsten and germanium according to claim 2.

4. The semiconductor device according to claim 3, comprising a stack structure of a semiconductor substrate and the compound film of tungsten and germanium.

5. The semiconductor device according to claim 4, comprising a stack structure in which the semiconductor substrate, the compound film of tungsten and germanium and a metal electrode are laminated in this order.

6. A semiconductor device comprising the compound film of tungsten and germanium according to claim 1.

7. The semiconductor device according to claim 6, comprising a stack structure of a semiconductor substrate and the compound film of tungsten and germanium.

8. The semiconductor device according to claim 7, comprising a stack structure in which the semiconductor substrate, the compound film of tungsten and germanium and a metal electrode are laminated in this order.

9. The semiconductor device according to claim 4, wherein the semiconductor substrate is any one of a germanium substrate, a silicon substrate and a silicon germanium substrate.

10. The semiconductor device according claim 7, wherein the semiconductor substrate is any one of a germanium substrate, a silicon substrate and a silicon germanium substrate.

11. The semiconductor device according claim 7, wherein the precursors of the tungsten/germanium compound are aggregated at a temperature of 120° C. or more and 270° C. or less.

12. The compound film of tungsten and germanium according to claim 1, wherein the precursors of the tungsten/germanium compound are aggregated at a temperature of 120° C. or more and 270° C. or less.

13. A semiconductor device having a stack structure comprising:
   a semiconductor substrate;
   a compound film of tungsten and germanium formed by a tungsten/germanium compound consisting of tungsten and germanium; and
   a metal electrode, wherein
   the semiconductor substrate, the compound film of tungsten and germanium and the metal electrode are laminated in this order,
   the compound film of tungsten and germanium is created by aggregating precursors of the tungsten/germanium compound,
   the precursors of the tungsten/germanium compound are formed at a temperature of 120° C. or more and 270° C. or less, the compound film of tungsten and germanium has a germanium/tungsten composition ratio of 1 or more and 3.2 or less, and the compound film of tungsten and germanium comprises an optical energy gap.

14. The semiconductor device according to claim 13, wherein the semiconductor substrate is any one of a germanium substrate, a silicon substrate and a silicon germanium substrate.

15. The semiconductor device according to claim 13, wherein within the stack structure, the germanium/tungsten composition ratio has a composition gradient such that the tungsten composition increases from the semiconductor substrate to the metal electrode in a stepwise manner or in a continuous manner.

16. A method for manufacturing the compound film of tungsten and germanium formed by a tungsten/germanium compound consisting of tungsten and germanium, the method comprising:

causing a material gas of tungsten to chemically react with a material gas of germanium; creating precursors of the tungsten/germanium compound at a temperature of 120° C. or more and 270° C. or less; and aggregating the precursors of the tungsten/germanium compound in at least one of a region in a gas phase and a region on a substrate and thereby producing the tungsten/germanium compound on the substrate, wherein the compound film of tungsten and germanium has a germanium/tungsten composition ratio of 0.2 or more and less than 6, and the compound film of tungsten and germanium comprises an optical energy gap.

17. The method for manufacturing the compound film of tungsten and germanium according to claim 16, wherein a pressure of the material gas of germanium is controlled within a range of 0.1 Pa more and 2000 Pa or less.

18. The method for manufacturing the compound film of tungsten and germanium according to claim 16, wherein the precursors of the tungsten/germanium compound are aggregated at a temperature of 120° C. or more and 270° C. or less.

19. An apparatus for manufacturing a compound film of tungsten and germanium formed by a tungsten/germanium compound consisting of tungsten and germanium by supplying a material gas of tungsten and a material gas of germanium, causing the material gas of tungsten to chemically react with the material gas of germanium, creating precursors of the tungsten/germanium compound at a temperature of 120° C. or more and 270° C. or less, and aggregating the precursors of the tungsten/germanium compound in at least one of a region in a gas phase and a region on a substrate and thereby producing the tungsten/germanium compound, the apparatus comprising a heating mechanism to keep the material gas of tungsten and the material gas of germanium at the temperature of 120° C. or more and 270° C. or less for creating the precursors of the tungsten/germanium compound, wherein the compound film of tungsten and germanium has a germanium/tungsten composition ratio of 0.2 or more and less than 6, and the compound film of tungsten and germanium comprises an optical energy gap.

\* \* \* \* \*

UNITED STATES PATENT AND TRADEMARK OFFICE
CERTIFICATE OF CORRECTION

PATENT NO. : 10,692,986 B2
APPLICATION NO. : 16/302441
DATED : June 23, 2020
INVENTOR(S) : Naoya Okada Page 1 of 1

It is certified that error appears in the above-identified patent and that said Letters Patent is hereby corrected as shown below:

In the Claims

Column 13, Lines 61-62, In Claim 1, after "germanium" delete "comprising".

Column 14, Line 18 (approx.), In Claim 9, delete "claim 4," and insert -- claim 8, --, therefor.

Column 14, Line 23 (approx.), In Claim 10, after "according" insert -- to --.

Column 14, Line 27, In Claim 11, after "according" insert -- to --.

Column 15, Line 1, In Claim 16, delete "the" and insert -- a --, therefor.

Signed and Sealed this
First Day of September, 2020

Andrei Iancu
*Director of the United States Patent and Trademark Office*